United States Patent
Kim et al.

(10) Patent No.: US 7,763,542 B2
(45) Date of Patent: Jul. 27, 2010

(54) SEMICONDUCTOR MEMORY DEVICE AND METHOD OF FABRICATING THE SAME

(75) Inventors: Jin-Gyun Kim, Gyeonggi-do (KR); Ki-Sun Kim, Seoul (KR); Jae-Young Ahn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 11/505,264

(22) Filed: Aug. 16, 2006

(65) Prior Publication Data

US 2007/0082492 A1 Apr. 12, 2007

(30) Foreign Application Priority Data

Oct. 12, 2005 (KR) .................. 10 2005-0096108

(51) Int. Cl.
*H01L 21/311* (2006.01)

(52) U.S. Cl. .............. 438/694; 438/367; 438/388; 438/639; 438/696; 257/386; 257/503; 257/547; 257/E21.658; 257/E21.657; 257/E27.087; 257/E27.088

(58) Field of Classification Search ............... 438/694
See application file for complete search history.

(56) References Cited

U.S. PATENT DOCUMENTS

| | | | | |
|---|---|---|---|---|
| 4,656,732 A * | 4/1987 | Teng et al. | ........... | 438/639 |
| 5,248,628 A * | 9/1993 | Okabe et al. | ........... | 438/256 |
| 5,292,677 A * | 3/1994 | Dennison | ........... | 438/396 |
| 5,381,302 A * | 1/1995 | Sandhu et al. | ........... | 361/305 |
| 5,600,177 A * | 2/1997 | Yamazaki | ........... | 257/588 |
| 5,604,156 A * | 2/1997 | Chung et al. | ........... | 438/620 |
| 5,698,902 A * | 12/1997 | Uehara et al. | ........... | 257/773 |
| 5,874,756 A * | 2/1999 | Ema et al. | ........... | 257/296 |
| 6,127,734 A * | 10/2000 | Kimura | ........... | 257/774 |
| 6,174,767 B1 * | 1/2001 | Chi | ........... | 438/253 |
| 6,218,237 B1 * | 4/2001 | Sandhu et al. | ........... | 438/253 |
| 6,218,299 B1 * | 4/2001 | Akahori et al. | ........... | 438/682 |
| 6,221,714 B1 * | 4/2001 | Jang | ........... | 438/241 |
| 6,281,073 B1 | 8/2001 | Lee | | |
| 6,313,031 B1 * | 11/2001 | Schuele et al. | ........... | 438/643 |
| 6,316,306 B1 * | 11/2001 | Park | ........... | 438/239 |
| 6,472,266 B1 * | 10/2002 | Yu et al. | ........... | 438/241 |

(Continued)

FOREIGN PATENT DOCUMENTS

CN 1166056 A 11/2007

(Continued)

OTHER PUBLICATIONS

Office Action from Chinese Patent Application No. 200610126608.4 dated May 9, 2008.

*Primary Examiner*—Fernando L Toledo
*Assistant Examiner*—Ankush K Singal
(74) *Attorney, Agent, or Firm*—Myers Bigel Sibley & Sajovec, P.A.

(57) ABSTRACT

A semiconductor memory device includes a semiconductor substrate. An inter-layer dielectric is disposed on the semiconductor substrate. A bit line is disposed on the inter-layer dielectric. A bit line spacer is fabricated of a nitride layer containing boron and/or carbon and covers sidewalls of the bit line. A method of fabricating the semiconductor memory device is also provided.

10 Claims, 13 Drawing Sheets

U.S. PATENT DOCUMENTS

| | | | | |
|---|---|---|---|---|
| 6,563,162 B2* | 5/2003 | Han et al. | | 257/306 |
| 6,589,867 B2* | 7/2003 | Schuele et al. | | 438/653 |
| 6,602,749 B2* | 8/2003 | Tu et al. | | 438/253 |
| 6,649,508 B1* | 11/2003 | Park et al. | | 438/618 |
| 6,670,238 B2* | 12/2003 | Deboer et al. | | 438/255 |
| 6,731,008 B1* | 5/2004 | Tomita et al. | | 257/774 |
| 6,777,305 B2* | 8/2004 | Lee et al. | | 438/396 |
| 6,784,068 B2* | 8/2004 | Lee et al. | | 438/396 |
| 6,835,970 B2* | 12/2004 | Nam et al. | | 257/202 |
| 6,852,579 B2* | 2/2005 | Kumauchi et al. | | 438/167 |
| 6,878,587 B2* | 4/2005 | Deboer et al. | | 438/254 |
| 6,929,999 B2* | 8/2005 | Park et al. | | 438/253 |
| 6,930,039 B2* | 8/2005 | Schuele et al. | | 438/643 |
| 6,951,805 B2* | 10/2005 | Moore | | 438/618 |
| 6,992,347 B2* | 1/2006 | Ema et al. | | 257/308 |
| 7,253,525 B2* | 8/2007 | Ema | | 257/773 |
| 7,268,072 B2* | 9/2007 | Deboer et al. | | 438/637 |
| 7,282,439 B2* | 10/2007 | Weimer et al. | | 438/636 |
| 7,298,024 B2* | 11/2007 | Yin et al. | | 257/646 |
| 7,341,957 B2* | 3/2008 | Sandhu et al. | | 438/717 |
| 2001/0009286 A1* | 7/2001 | Sandhu et al. | | 257/308 |
| 2001/0035551 A1* | 11/2001 | Kotecki et al. | | 257/306 |
| 2001/0045658 A1* | 11/2001 | Deboer et al. | | 257/758 |
| 2002/0056868 A1* | 5/2002 | Wu | | 257/310 |
| 2002/0079596 A1* | 6/2002 | Terauchi | | 257/908 |
| 2002/0086479 A1* | 7/2002 | Reinberg | | 438/239 |
| 2002/0145199 A1* | 10/2002 | Nakamura et al. | | 257/752 |
| 2002/0153614 A1* | 10/2002 | Ema et al. | | 257/773 |
| 2003/0027416 A1* | 2/2003 | Moore | | 438/618 |
| 2004/0164336 A1* | 8/2004 | Weimer et al. | | 257/296 |
| 2004/0175952 A1* | 9/2004 | Ema et al. | | 438/692 |
| 2004/0219736 A1* | 11/2004 | Yoshitaka | | 438/222 |
| 2004/0241940 A1* | 12/2004 | Lee et al. | | 438/256 |
| 2005/0205892 A1* | 9/2005 | Yanagihara et al. | | 257/184 |
| 2006/0094194 A1* | 5/2006 | Chen et al. | | 438/301 |
| 2006/0264047 A1* | 11/2006 | Kim et al. | | 438/684 |
| 2007/0037344 A1* | 2/2007 | Ema | | 438/238 |
| 2007/0123040 A1* | 5/2007 | Hwang et al. | | 438/672 |

FOREIGN PATENT DOCUMENTS

| | | |
|---|---|---|
| JP | 10-178160 | 6/1998 |
| KR | 1020020055200 A | 7/2002 |
| KR | 1020050030330 A | 3/2005 |

\* cited by examiner

SEMICONDUCTOR MEMORY DEVICE AND METHOD OF FABRICATING THE SAME

CROSS-REFERENCE TO RELATED APPLICATION

This application claims the benefit of Korean Patent Application No. 2005-96108, filed Oct. 12, 2005, the contents of which are hereby incorporated herein by reference in their entirety.

FIELD OF THE INVENTION

The present invention relates to semiconductor devices and methods of fabricating same and, more particularly, to semiconductor memory devices and methods of fabricating same.

BACKGROUND OF THE INVENTION

Silicon nitride layers (SiNx), for example those deposited by a Low Pressure Chemical Vapor Deposition (LPCVD) method among insulating materials during semiconductor fabrication processes, have been widely used because of their excellent reactive ion etching (RIE) and wet etching selectivities with respect to silicon oxide layers, their abrasion resistance, their oxidation resistance, and their properties as a diffusion barrier. However, SiNx layers have a relatively high dielectric constant of about 7, so that parasitic capacitance may increase when a device is scaled down in size, which may cause propagation delay.

In recent years, boron nitride (BN) layers have been used as an insulating layer of semiconductor devices. BN layers have a dielectric constant that is generally lower than LPCVD SiNx layers. Typically, BN layers are deposited at a low temperature of about 200° C. to 550° C. by an atomic layer deposition (ALD) method, so that a conformal stoichiometric boron nitride layer can be formed.

BN layers deposited by the ALD method typically have a low dielectric constant of about 2.2 to about 5, according to the deposition condition. Thus, the parasitic capacitance of BN layers may be reduced compared to SiNx layers having a dielectric constant of 7, thereby reducing propagation delay.

However, BN layers deposited by the ALD method may be hydrolyzed by moisture in the air, easily etched by a $H_2SO_4$-based high temperature wet chemical etch, and may have poor oxidation resistance.

SUMMARY OF THE INVENTION

According to an embodiment of the present invention, a semiconductor memory device suitable for suppressing parasitic capacitance is provided. The semiconductor memory device comprises a semiconductor substrate. An inter-layer dielectric is disposed on the semiconductor substrate. A bit line is disposed on the inter-layer dielectric. A bit line spacer is on, and in some embodiments covers, sidewalls of the bit line. In some embodiments, the bit line spacer is a nitride layer containing boron and/or carbon and covers sidewalls of the bit line.

In some embodiments of the present invention, the nitride layer may comprise at least one of a SiBN layer, a SiBCN layer, a SiCN layer, and a BCN layer.

In other embodiments, the semiconductor memory device may further comprise a conductive pattern disposed within the inter-layer dielectric, and a contact spacer on, and in some embodiments covering, sidewalls of the conductive pattern. In this embodiment, the inter-layer dielectric has an upper and a lower inter-layer dielectric, the conductive pattern penetrates the upper inter-layer dielectric, and the contact spacer is a nitride layer containing boron and/or carbon.

In yet other embodiments, the nitride layer may comprise a SiBN layer, a SiBCN layer, a SiCN layer, and/or a BCN layer.

According to embodiments of the present invention, a semiconductor memory device suitable for suppressing parasitic capacitance is provided. The semiconductor memory device comprises a semiconductor substrate. An inter-layer dielectric is disposed on the semiconductor substrate. A bit line pattern is disposed on the inter-layer dielectric and has a bit line conductive layer pattern and a bit line capping layer pattern which are sequentially stacked. A bit line spacer covers sidewalls of the bit line pattern and is a nitride layer containing boron and/or carbon.

In some embodiments of the present invention, at least one of the bit line capping layer pattern and the bit line spacer may be a SiBN layer, a SiBCN layer, a SiCN layer, and/or a BCN layer.

In other embodiments, the semiconductor memory device may further comprise a gate pattern disposed within the inter-layer dielectric and may have a gate conductive layer pattern and a gate capping layer pattern which are sequentially stacked. A gate spacer may cover sidewalls of the gate pattern. In this case, at least one of the gate capping layer pattern and the gate spacer may be a SiBN layer, a SiBCN layer, a SiCN layer, and/or a BCN layer.

In yet other embodiments, the semiconductor memory device may further comprise a first conductive pattern disposed within the inter-layer dielectric, and a contact spacer covering sidewalls of the first conductive pattern. In this embodiment, the inter-layer dielectric has an upper and a lower inter-layer dielectric, the first conductive pattern penetrates the upper inter-layer dielectric, and the contact spacer is a nitride layer containing boron and/or carbon.

In still other embodiments, the nitride layer may comprise a SiBN layer, a SiBCN layer, a SiCN layer, and/or a BCN layer.

In still other embodiments, the semiconductor memory device may further comprise a storage node disposed on the inter-layer dielectric. A second conductive pattern may penetrate the inter-layer dielectric. In this case, the storage node may be electrically connected to the second conductive pattern.

According to yet another embodiment of the present invention, a method of fabricating a semiconductor memory device suitable for suppressing parasitic capacitance is provided. The method comprises forming an inter-layer dielectric on a semiconductor substrate. A bit line conductive layer pattern and a bit line capping layer pattern are sequentially stacked on the inter-layer dielectric to form a bit line pattern. A bit line spacer comprising a nitride layer containing boron and/or carbon covers sidewalls of the bit line pattern.

In some embodiments of the present invention, the bit line capping layer pattern and/or the bit line spacer may comprise a SiBN layer, a SiBCN layer, a SiCN layer, and/or a BCN layer.

In other embodiments, forming the bit line capping layer pattern and the bit line spacer may be performed by an ALD method.

In yet other embodiments, the ALD process may be performed under a pressure of about 0.1 torr to about 3 torr and at a substrate temperature of about 400° C. to about 800° C.

In still other embodiments, a gate conductive layer pattern and a gate capping layer pattern may be sequentially stacked within the inter-layer dielectric to form a gate pattern. A gate spacer may be formed to cover sidewalls of the gate pattern.

In this embodiment, at least one of the gate capping layer pattern and the gate spacer may comprise a SiBN layer, a SiBCN layer, a SiCN layer, and/or a BCN layer.

In still other embodiments, the method may further comprise forming a first conductive pattern within the inter-layer dielectric. A contact spacer is formed to cover sidewalls of the first conductive pattern. In this embodiment, the inter-layer dielectric comprises a lower and an upper inter-layer dielectric, the first conductive pattern is formed to penetrate the upper inter-layer dielectric, and the contact spacer comprises a nitride layer containing born and/or carbon.

In still other embodiments, the nitride layer may comprise a SiBN layer, a SiBCN layer, a SiCN layer, and/or a BCN layer.

In still other embodiments, forming the contact spacer may be performed by an ALD method.

In still other embodiments, the method may further comprise forming a storage node on the inter-layer dielectric. A second conductive pattern may be formed to penetrate the inter-layer dielectric. In this embodiment, the storage node may be electrically connected to the second conductive pattern.

BRIEF DESCRIPTION OF THE DRAWINGS

The foregoing and other objects, features and advantages of the invention will be apparent from the more particular description of embodiments of the invention, as illustrated in the accompanying drawings. The drawings are not necessarily to scale, emphasis instead being placed upon illustrating the principles of the invention.

DETAILED DESCRIPTION OF THE INVENTION

Figure 1:
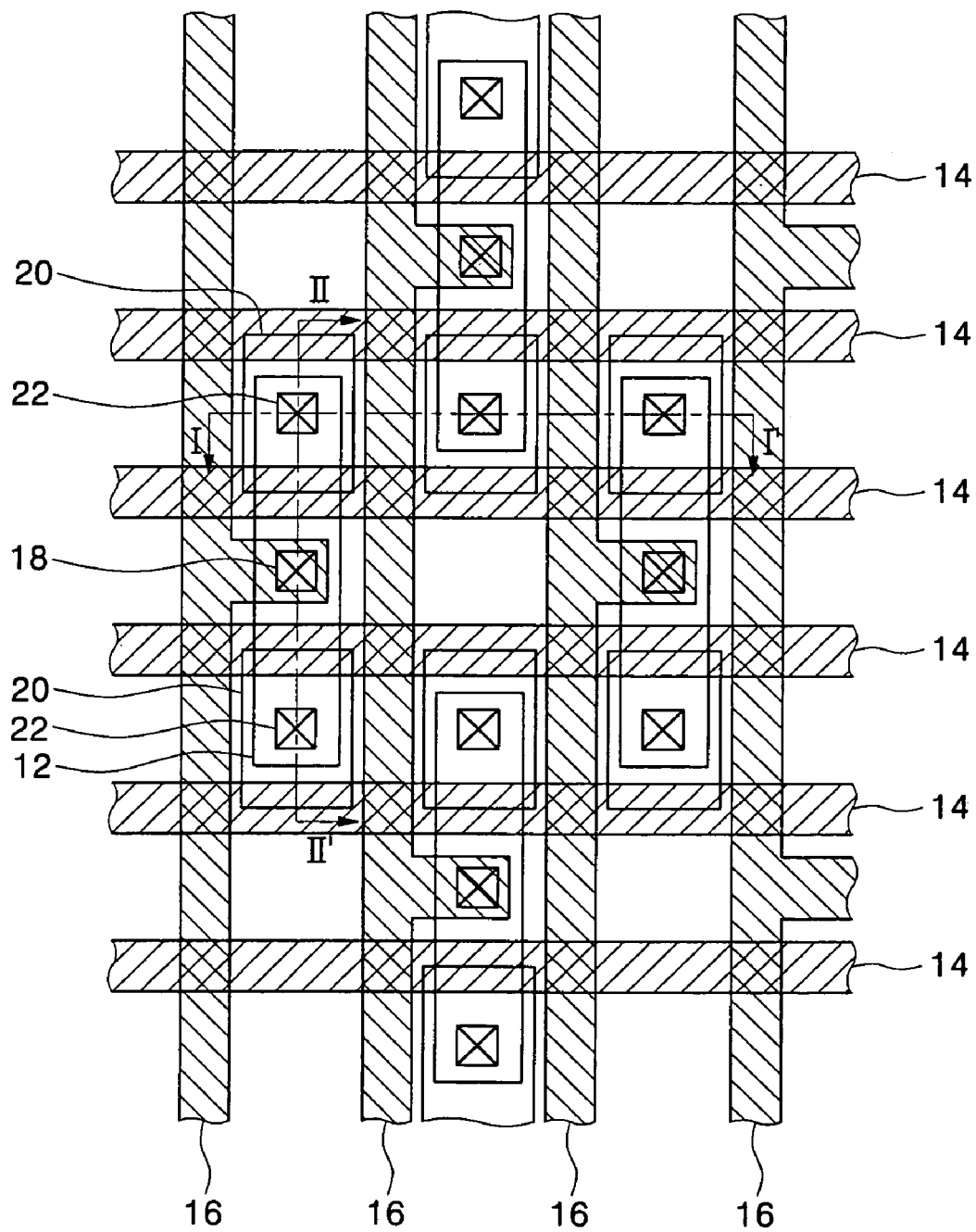
FIG. 1 is a layout of a semiconductor memory device in accordance with embodiments of the present invention.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to;" "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to plan view and cross-sectioned illustrations that are schematic illustrations of idealized embodiments of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus; the regions illustrated in the figures are schematic in nature and their shapes are not intended to illustrate the actual shape of a region of a device and are not intended to limit the scope of the present invention unless expressly so defined herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 is a layout of a semiconductor memory device in accordance with embodiments of the present invention. FIGS. 2A, 3A, 4A, 5A, 6A, 7A, 8A, 9A, 10A, 11A, 12A, 13A, 14A, and 15A are cross-sectional views taken along line I-I' of FIG. 1 illustrating methods of fabricating a semiconductor memory device in accordance with embodiments of the present invention. FIGS. 2B, 3B, 4B, 5B, 6B, 7B, 8B, 9B, 10B, 11B, 12B, 13B, 14B, and 15B are cross-sectional views taken along line II-II' of FIG. 1 illustrating methods of fabricating a semiconductor memory device in accordance with embodiments of the present invention.

Referring to FIG. 1, active regions 12 are arranged in predetermined regions of a semiconductor substrate in a two-dimensional manner. Word lines 14 crossing the active regions 12 are arranged generally parallel to one another, as illustrated. In the illustrated embodiment, each of the active regions 12 crosses a pair of word lines 14. As a result, each of the active regions 12 is divided into three regions by the pair of word lines 14. That is, the active region between the pair of word lines 14 acts as a common drain region, and the active regions disposed at both sides of the common drain region act as source regions. Bit lines 16 crossing the word lines 14 are arranged generally parallel to one another, as illustrated. The bit lines 16 are electrically connected to bit line contact plugs 18 crossing the bit lines. The bit line contact plugs 18 are electrically connected to the common drain regions.

Storage nodes 20 are disposed on the source regions, as illustrated. The storage nodes 20 are electrically connected to the source regions via storage node contact plugs 22.

Figure 2A:
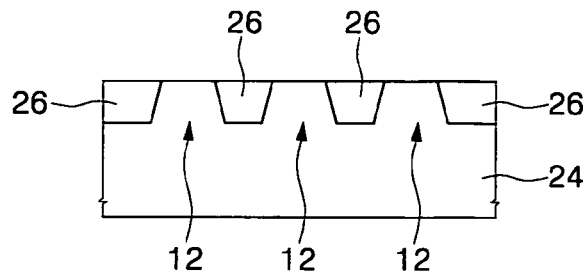
FIGS. 2A, 3A, 4A, 5A, 6A, 7A, 8A, 9A, 10A, 11A, 12A, 13A, 14A, and 15A are cross-sectional views taken along line I-I' of FIG. 1 illustrating a method of fabricating a semiconductor memory device in accordance with embodiments of the present invention.
Figure 2B:
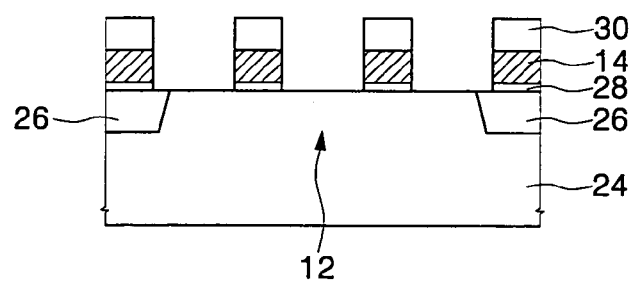
FIGS. 2B, 3B, 4B, 5B, 6B, 7B, 8B, 9B, 10B, 11B, 12B, 13B, 14B, and 15B are cross-sectional views taken along line II-II' of FIG. 1 illustrating a method of fabricating a semiconductor memory device in accordance with embodiments of the present invention.

Referring to FIGS. 1, 2A, and 2B, a semiconductor substrate 24 is prepared. The semiconductor substrate 24 may be a bulk single element or compound semiconductor substrate or a semiconductor layer on another substrate. Isolation layers 26 are formed in predetermined regions of the semiconductor substrate 24 to define the active regions 12. A gate insulating layer 28 is formed on the active region 12. A gate conductive layer is formed on the entire surface of the substrate having the gate insulating layer 28. The gate conductive layer and the gate insulating layer 28 are sequentially patterned. As a result, a gate line is formed on the gate insulating layer 28. The gate line acts as the word line 14.

The gate insulating layer 28 may be formed of a silicon oxide layer and/or a high-k dielectric layer. The term "high-k dielectric layer" means a dielectric layer having a higher dielectric constant than the silicon oxide layer. The gate conductive layer may be formed of a polysilicon layer and/or a metal layer. When the gate conductive layer is formed of a polysilicon layer, a metal silicide layer may be formed on the polysilicon layer in order to enhance conductivity of the polysilicon layer. When the gate conductive layer is patterned, a capping insulating layer may be formed to protect the gate conductive layer. That is, a capping insulating layer pattern 30 may be formed on the word lines 14. The capping insulating layer pattern 30 may be formed of a nitride layer containing boron and/or carbon. In this embodiment, the nitride layer containing boron and/or carbon may be formed by an ALD process. The nitride layer containing boron and/or carbon may be formed of a SiBN layer, a SiBCN layer, a SiCN layer, or a BCN layer.

Figure 3A:
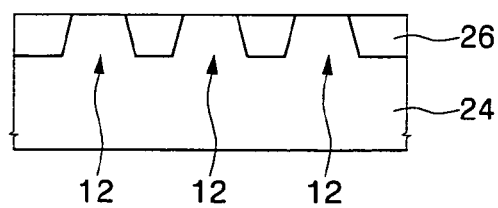
Figure 3B:
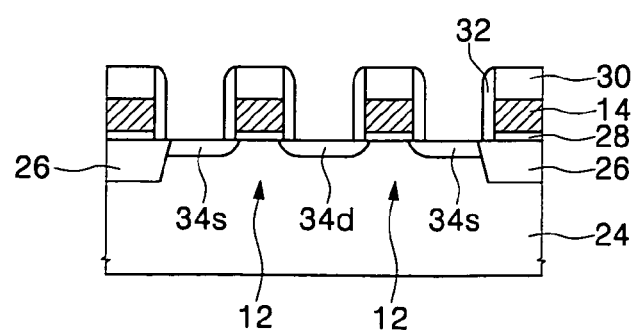

Referring to FIGS. 1, 3A, and 3B, gate spacers 32 may be formed to cover sidewalls of the word lines 14. The gate spacers 32 may be formed of a nitride layer containing boron and/or carbon. In this embodiment, the nitride layer containing boron and/or carbon may be formed by an ALD process. The nitride layer containing boron and/or carbon may comprise a SiBN layer, a SiBCN layer, a SiCN layer, and/or a BCN layer. Impurity ions may be implanted into the active regions 12 using the capping insulating layer pattern 30 and the gate spacers 32 as ion implantation masks to form common drain regions 34d and source regions 34s.

Figure 4A:
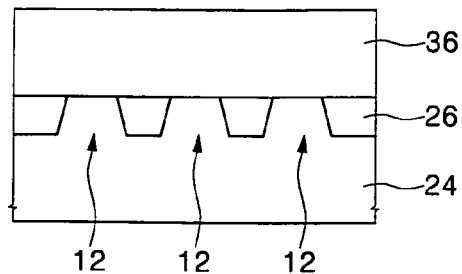
Figure 4B:
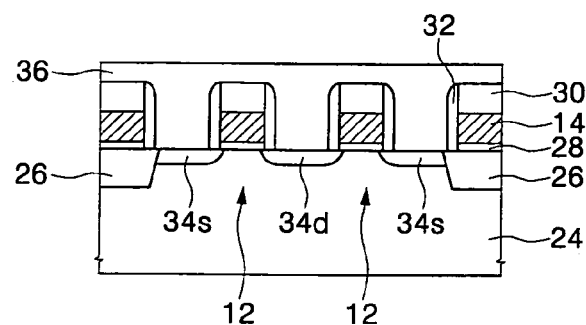

Referring FIGS. 1, 4A, and 4B, a first inter-layer dielectric 36 is formed on the entire surface of the substrate 24 having the word lines 14.

Figure 5A:
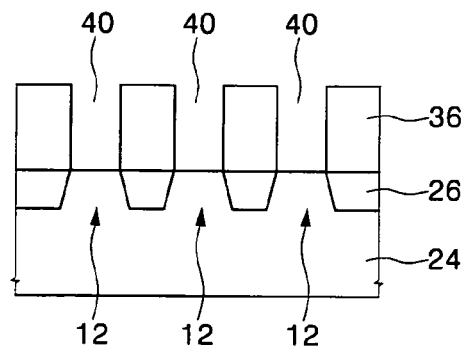
Figure 5B:
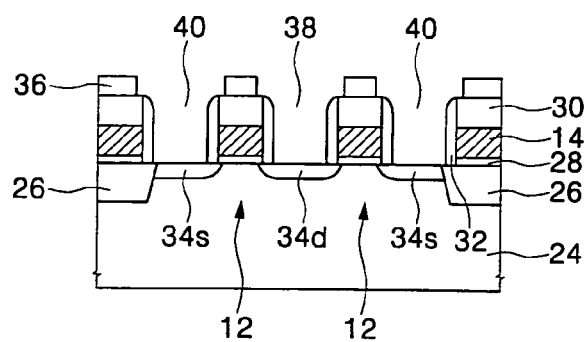

Referring to FIGS. 1, 5A, and 5B, the first inter-layer dielectric 36 is patterned to form bit line pad contact holes 38 and storage node pad contact holes 40 which expose the common drain regions 34d and the source regions 34s, respectively.

Figure 6A:
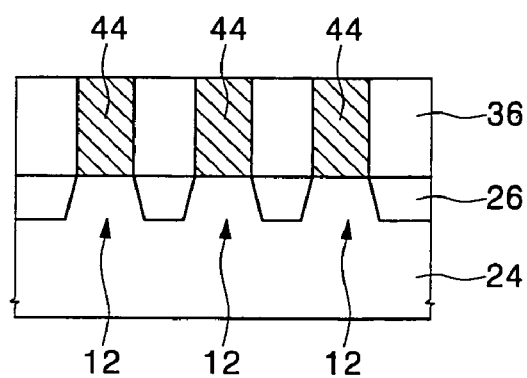
Figure 6B:
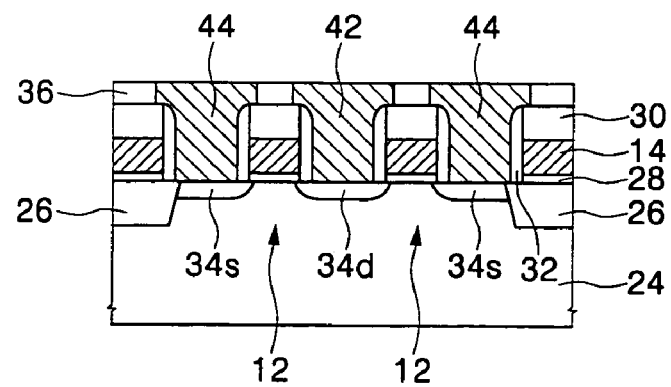

Referring to FIGS. 1, 6A, and 6B, a conductive layer is formed on the surface of the substrate 24 having the bit line pad contact holes 38 and the storage node pad contact holes 40. The conductive layer may be formed of a polysilicon layer and/or a metal layer. The conductive layer is planarized to form bit line pads 42 and storage node pads 44 which fill the bit line pad contact holes 38 and the storage node pad contact holes 40, respectively. The bit line pads 42 are electrically connected to the common drain regions 34d. Similarly, the storage node pads 44 are electrically connected to the source regions 34s.

Figure 7A:
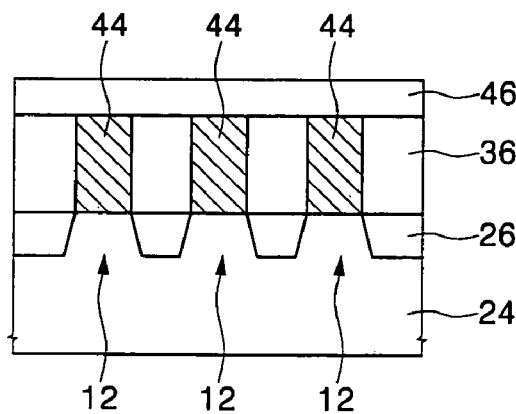
Figure 7B:
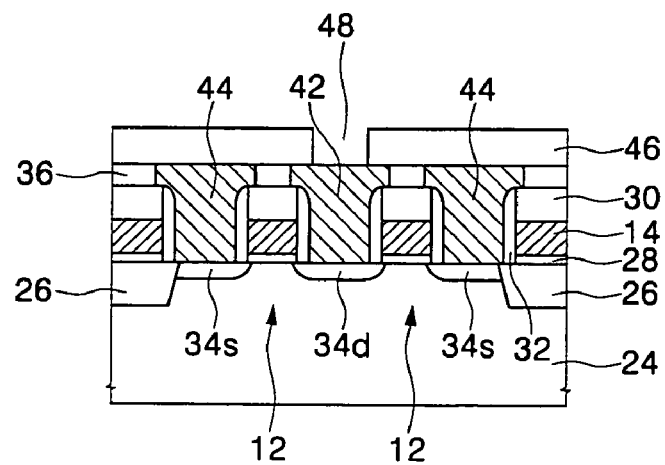

Referring to FIGS. 1, 7A, and 7B, a second inter-layer dielectric 46 is formed on the surface of the substrate having the bit line pads 42 and the storage node pads 44. The second inter-layer dielectric 46 is patterned to form bit line contact holes 48 exposing the bit line pads 42.

Figure 8A:
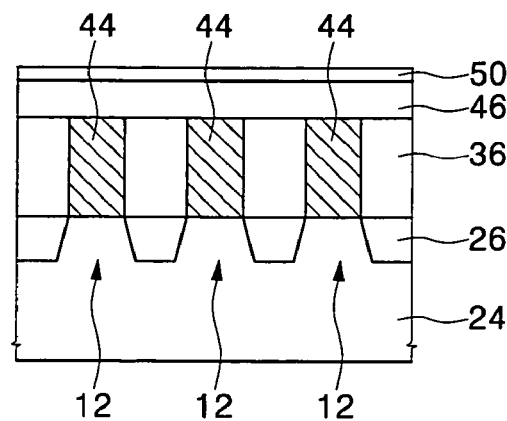
Figure 8B:
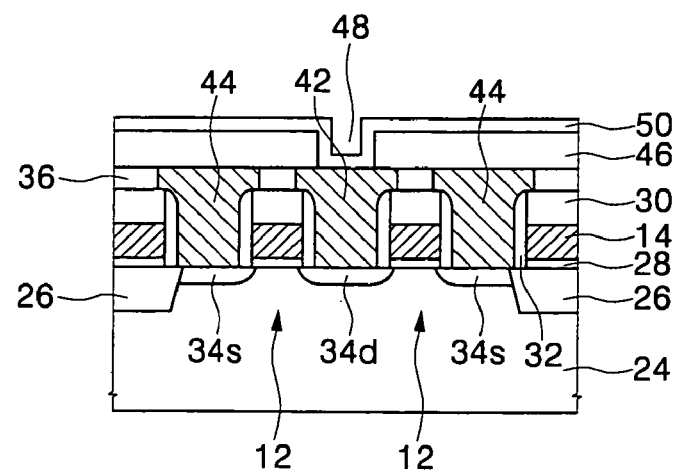

Referring to FIGS. 1, 8A, and 8B, a nitride layer 50 containing boron and/or carbon is formed on the surface of the substrate having the bit line contact holes 48. That is, the nitride layer 50 containing boron and/or carbon can fill the bit line contact holes 48. In this embodiment, the nitride layer 50 containing boron and/or carbon may be formed by an ALD process. The nitride layer 50 containing boron and/or carbon may be formed of a SiBN layer, a SiBCN layer, a SiCN layer, and/or a BCN layer.

Figure 9A:
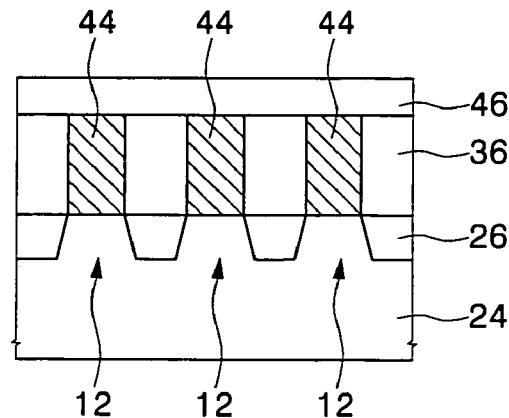
Figure 9B:
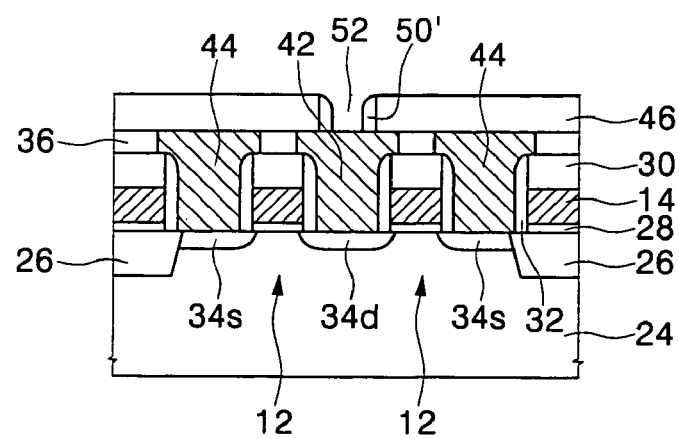

Referring to FIGS. 1, 9A, and 9B, the nitride layer 50 containing boron and/or carbon is etched by an etch-back process. As a result, bit line contact hole spacers 50' are formed to cover sidewalls of the bit line contact holes 48, as illustrated. While the bit line contact hole spacers 50' are formed, via holes 52 are formed to expose top surfaces of the bit line contact pads 42, as illustrated. That is, the via holes 52 are formed within the bit line contact hole spacers 50'.

Figure 10A:
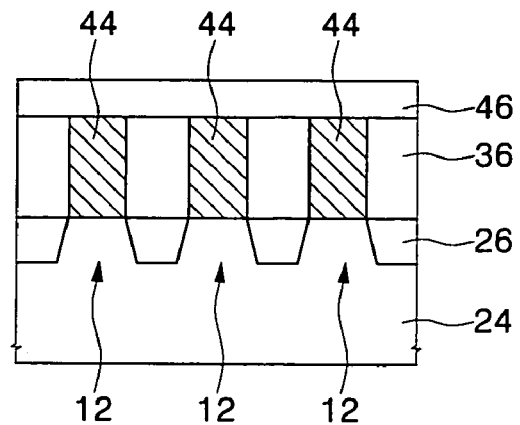
Figure 10B:
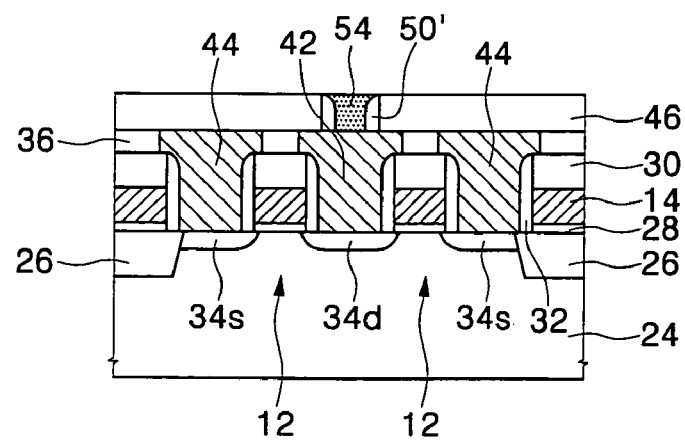

Referring to FIGS. 1, 10A, and 10B, a conductive layer is formed on the surface of the substrate having the via holes 52 and the bit line contact hole spacers 50'. The conductive layer may be formed of a polysilicon layer and/or a metal layer. The conductive layer is planarized to form bit line contact plugs 54 filling the via holes 52, as illustrated. As a result, the bit line contact hole spacers 50' cover sidewalls of the bit line contact plugs 54. In this case, the bit line contact plugs 54 may be electrically connected to the bit line contact pads 42.

Figure 11A:
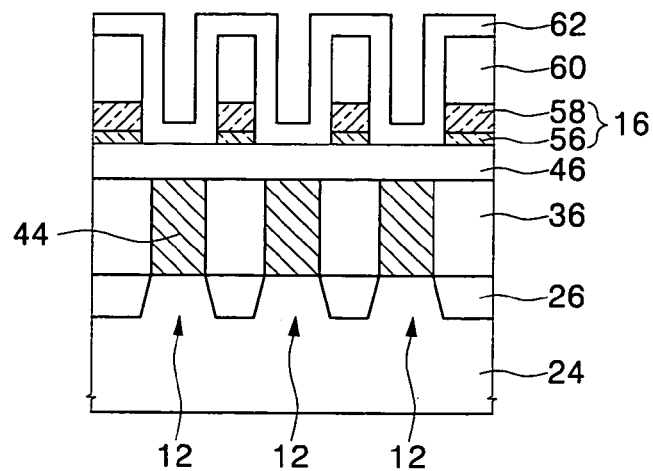
Figure 11B:
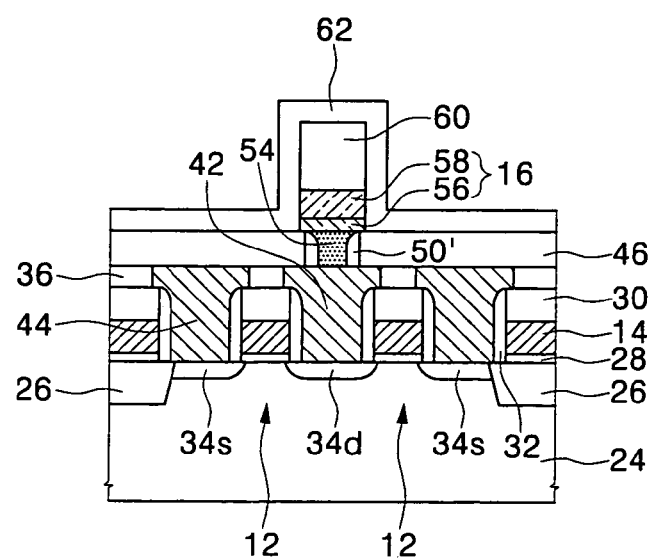

Referring to FIGS. 1, 11A, and 11B, a barrier metal layer and a conductive layer are sequentially formed on the entire surface of the substrate having the bit line contact plugs 54. The barrier metal layer may be formed of a titanium (Ti) layer and/or a titanium nitride (TiN) layer. The conductive layer may be formed of a polysilicon layer and/or a metal layer. The metal layer may be formed of a tungsten layer. The conductive layer and the barrier metal layer are sequentially patterned to form bit lines 16 having barrier metal layer patterns 56 and conductive layer pattern 58 which are sequentially stacked. The bit lines 16 may be electrically connected to the bit line contact plugs 54. In this case, bit line capping layers 60 may be formed on the bit lines 16. The bit line capping layers 60 may be formed of a SiBN layer, a SiBCN layer, a SiCN layer, or a BCN layer. A nitride layer 62 containing boron and/or carbon is formed on the entire surface of the substrate having the bit lines 16 and the bit line capping layers

60. In this case, the nitride layer containing boron and/or carbon may be formed by an ALD process. The nitride layer containing boron and/or carbon may be formed of a SiBN layer, a SiBCN layer, a SiCN layer, or a BCN layer.

Figure 12A:
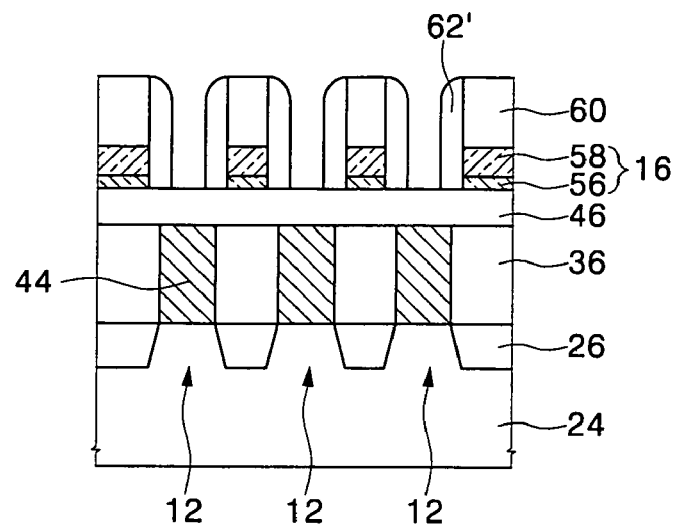
Figure 12B:
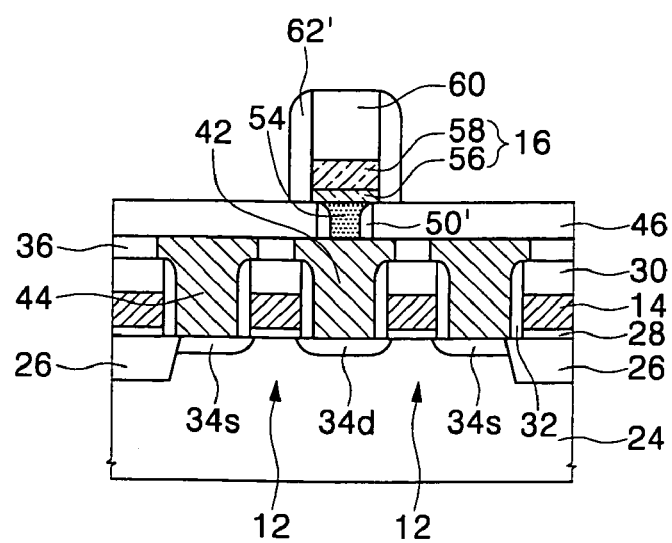

Referring to FIGS. 1, 12A, and 12B, the nitride layer 62 containing boron and/or carbon is etched by an etch-back process to form bit line spacers 62' covering sidewalls of the bit lines 16.

In this case, the bit lines 16 may be formed by a damascene process. That is, an inter-layer dielectric may be formed on the surface of the substrate having the bit line contact plugs 54. The inter-layer dielectric may be patterned to form openings (not shown) exposing the bit line contact plugs 54. A barrier metal layer and a conductive layer may sequentially fill the openings to form the bit lines.

Figure 13A:
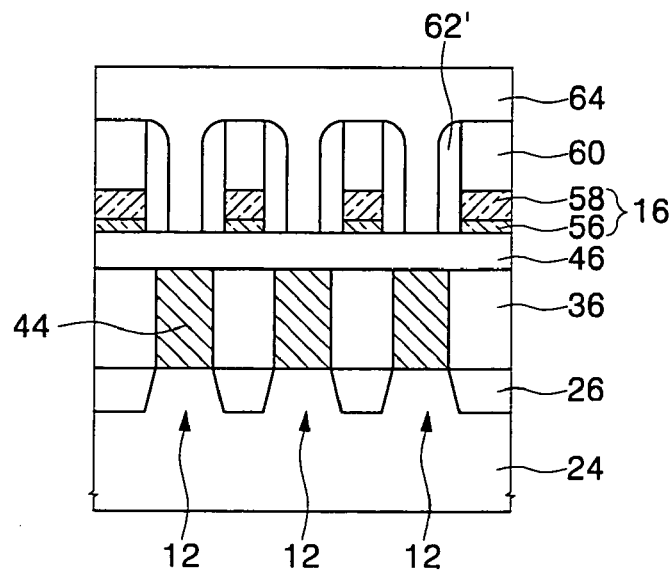
Figure 13B:
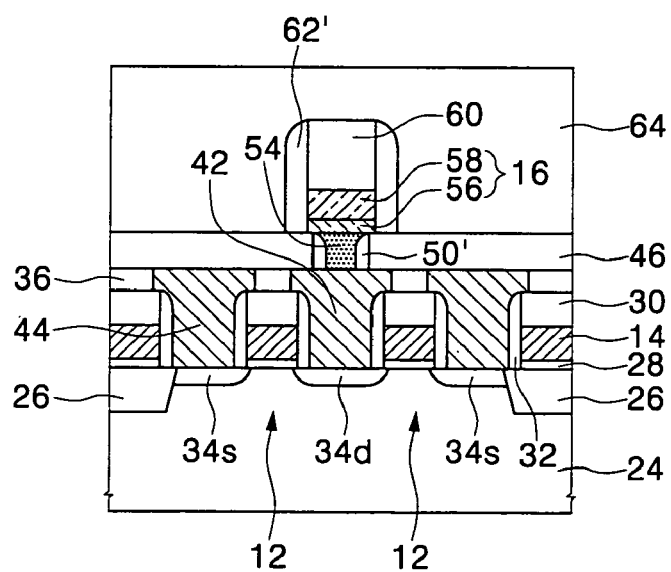

Referring to FIGS. 1, 13A, and 13B, a third inter-layer dielectric 64 may be formed on the surface of the substrate having the bit lines 16 and the bit line spacers 62'.

Figure 14A:
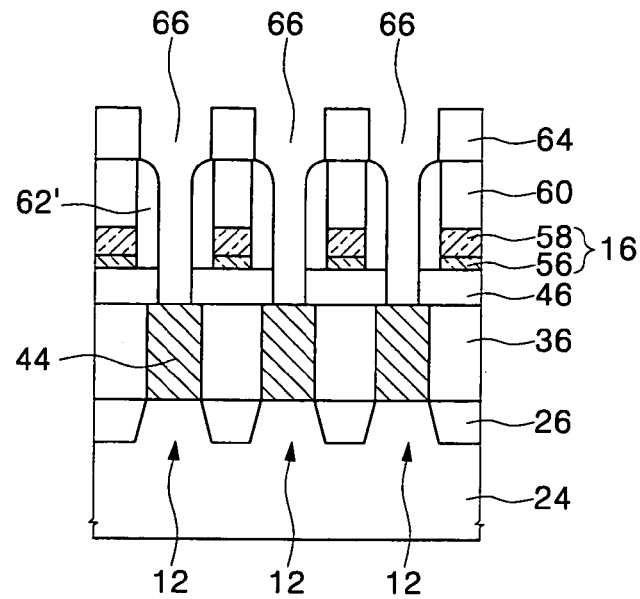
Figure 14B:
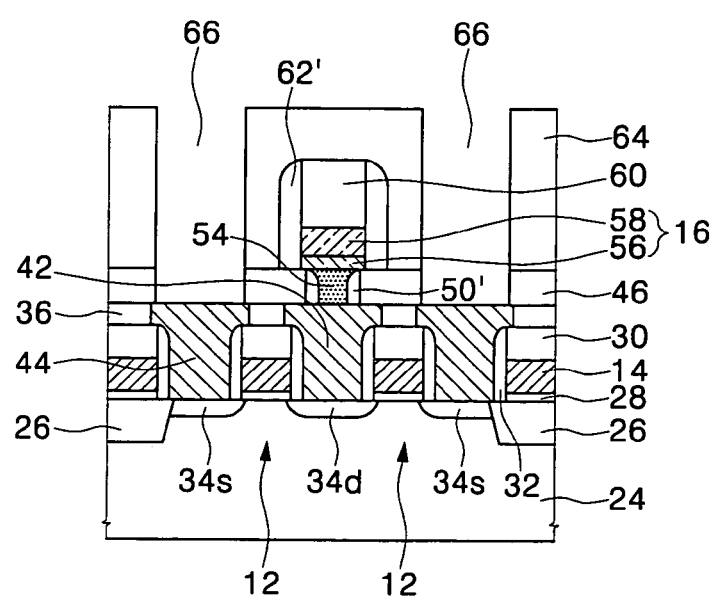

Referring to FIGS. 1, 14A, and 14B, the third inter-layer dielectric 64 and the second inter-layer dielectric 46 may be sequentially patterned to form openings 66 exposing the storage node pads 44, as illustrated.

Figure 15A:
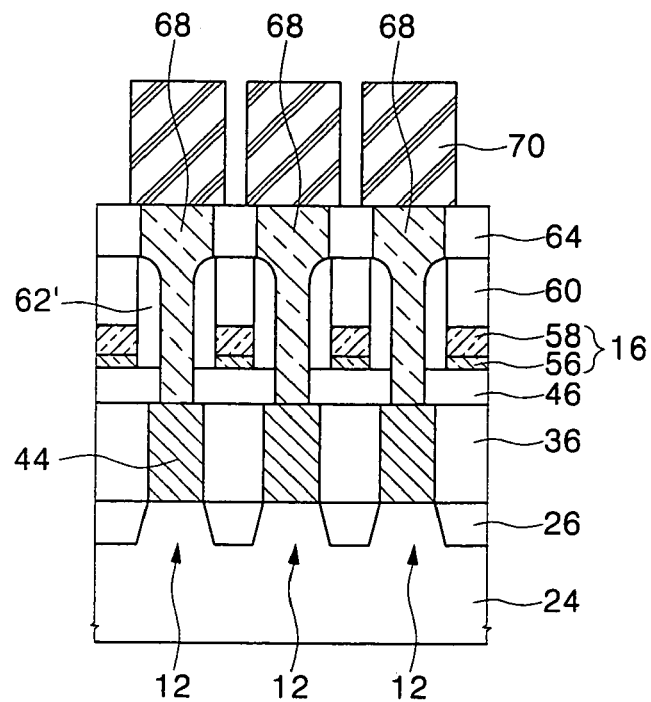
Figure 15B:
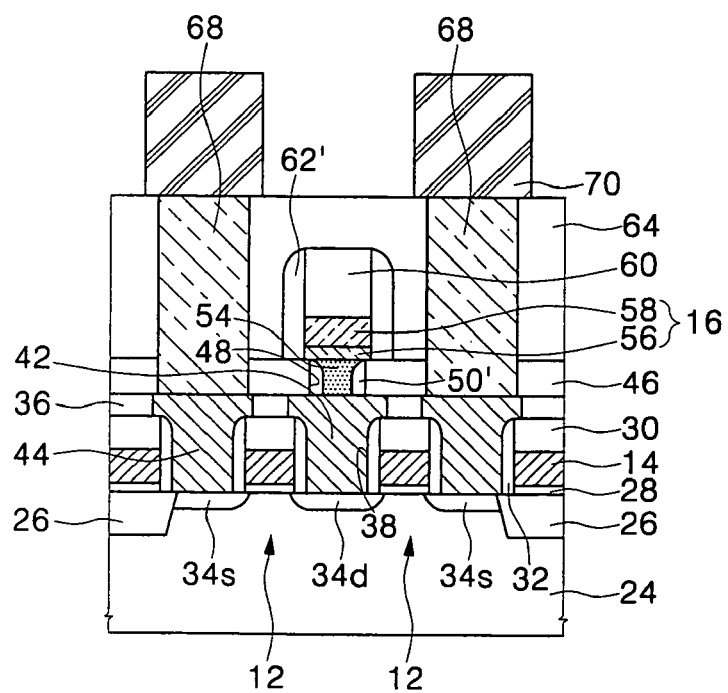

Referring to FIGS. 1, 15A, and 15B, a conductive layer may be formed on the entire surface of the substrate having the openings 66. The conductive layer may be formed of a polysilicon layer and/or a metal layer. The conductive layer may be planarized to form storage node contact plugs 68 filling the openings 66. In this embodiment, the storage node contact plugs 68 may be electrically connected to the storage node pads 44. Storage nodes 70 may be formed to be electrically connected to the storage node contact plugs 68.

Hereinafter, a method of forming the nitride layer containing boron and/or carbon using an ALD process will be described. The nitride layer containing boron and/or carbon may be formed of a SiBN layer, a SiBCN layer, a SiCN layer, and/or a BCN layer. The nitride layer containing boron and/or carbon has a lower dielectric constant than a silicon nitride layer. Among these layers, a description will be given with respect to the SiBN layer. The SiBN layer has a dielectric constant of about 4.4. Features and advantages of the SiBN layer are disclosed in U.S. Pat. No. 6,815,350, which is incorporated herein by reference in its entirety.

First, a wafer where the SiBN layer is to be deposited, for example, a single crystalline silicon substrate is loaded into a chamber (not shown) having a pump for keeping its internal pressure below an atmospheric pressure, and then heated at about 400° C. to 800° C., so that a cycle for depositing the SiBN layer is performed a predetermined number of times.

At a first step, first and second gases, each having a specific partial pressure, as source gases are injected into the chamber for a specific time to allow the first and second gases to be sufficiently adsorbed and saturated on a surface of the wafer. In this case, the first gas is $BCl_3$, $BBr_3$, $B_2H_6$, and/or $BF_3$, and the second gas is dichlorosilane (DCS, $SiH_2Cl_2$), hexa-chlorosilane (HCD, $Si_2Cl_6$), $SiCl_4$, $SiCl_6$, and/or silane ($SiH_4$). In some embodiments, $BCl_3$ having a gas flow rate of 0 sccm to 100 sccm and DCS ($SiH_2Cl_2$) having a gas flow rate of 100 sccm to 3 slm may be injected.

At a second step, a third gas, for example, an inactive gas such as Ar, He, or an $N_2$ gas is injected into the chamber, and then purges the unreacted first and second gases remaining in the chamber. As a result, the partial pressures of the first and second gases are reduced.

At a third step, a fourth gas having a specific partial pressure, for example, a reaction gas such as $NH_3$ and/or $N_2H_2$ gas is injected into the chamber for a specific time, and then reacts with the first and second gases adsorbed on the surface of the substrate, so that a SiBN monolayer may be formed of Si, B, and N. In some embodiments, the $NH_3$ gas having a gas flow rate of 500 sccm (standard cubic centimeters per minute) to 3 slm (standard cubic liters per minute) may be injected.

At the third step, the fourth gas may be dissolved by Inductive Coupled Plasma (ICP), DC, RF, or microwave plasma to increase reaction speed. In this embodiment, $NH_3$ and/or $N_2H_4$ gases may be used as the fourth gas, or $N_2$, $H_2$, $NH_3$, and a mixed gas thereof may be used in the form of radical as the fourth gas.

At a fourth step, a fifth gas, for example, an inactive gas such as Ar and/or He, or an $N_2$ gas is injected into the chamber to purge by-products such as HCl as well as the unreacted fourth gas remaining in the chamber. Accordingly, the partial pressure of the fourth gas in the chamber is sufficiently reduced.

The process of depositing the SiBN monolayer may be composed of four steps as described above, and the four steps may be performed as one cycle for depositing such a monolayer to form the SiBN layer having a desired thickness. That is, the deposition thickness of the SiBN layer deposited by the ALD method is constant in each cycle, so that a predetermined number of cycles are repeated in order to obtain the SiBN layer having a desired thickness.

When the inactive gas or the $N_2$ gas is injected to purge the unreacted gas or the by-products remaining in the chamber in the second and fourth steps, the inactive gas or the $N_2$ gas may be injected for purging during one cycle or may be injected for purging only during the second and fourth steps in some embodiments of the present invention.

In some embodiments, the size of the chamber for forming the SiBN layer by the above-described method may be about 7 liters, the temperature of the substrate may be about 400° C. to about 800° C., and its pressure may be about 0.1 torr to about 3 torr.

Hereinafter, a semiconductor memory device according to embodiments of the present invention will be described.

Referring to FIGS. 1, 15A, and 15B, the semiconductor memory device includes a semiconductor substrate 24 having active regions 12. A source region 34s and a drain region 34d are provided in the active regions 12. A gate pattern having a gate conductive layer pattern 14 and a gate capping layer pattern 30 which are sequentially stacked is disposed on the active regions 12. A gate insulating layer 28 is disposed between the active regions 12 and the gate conductive layer pattern 14. A first inter-layer dielectric 36 having a bit line pad contact hole 38 exposing the drain region 34d covers the gate pattern. A bit line contact pad 42 fills the bit line pad contact hole 38. A bit line pattern having a bit line conductive layer pattern 58 and a bit line capping layer pattern 60 which are sequentially stacked is electrically connected to the bit line contact pad 42. Barrier metal layer pattern 56 may be disposed under the bit line conductive layer pattern 58. A bit line spacer 62' may be a nitride layer containing boron and/or carbon and may cover sidewalls of the bit line pattern.

The gate capping layer pattern 30, the bit line capping layer pattern 60, or the bit line spacer 62' may be a SiBN layer, a SiBCN layer, a SiCN layer, and/or a BCN layer.

A second inter-layer dielectric having a bit line contact hole 48 exposing the bit line contact pad 42 may be disposed on the first inter-layer dielectric 36. A bit line plug 54 may fill the bit line contact hole 48. A contact hole spacer 50' may be interposed between a sidewall of the bit line contact hole 48 and the bit line plug 54. The contact hole spacer 50' may be a nitride layer containing boron and/or carbon.

The nitride layer containing boron and/or carbon may be a SiBN layer, a SiBCN layer, a SiCN layer, or a BCN layer.

A gate spacer 32 may cover sidewalls of the gate pattern. The gate spacer 32 may be a SiBN layer, a SiBCN layer, a SiCN layer, or a BCN layer.

A storage node 70 may be disposed on the first inter-layer dielectric 36. A storage node pad contact hole within the first inter-layer dielectric 36 may expose the source region 34s. A storage node contact pad 44 may fill the storage node pad contact hole 40. The storage node contact pad 44 may be electrically connected to the storage node 70.

According to some embodiments of the present invention as described above, the insulating layer of the semiconductor memory device is formed of a SiBN layer, a SiBCN layer, a SiCN layer, and/or a BCN layer by the ALD method, so that the step coverage and uniformity can be enhanced, and the RIE etch rate and the etch rate with respect to the high temperature chemical can be improved. In addition, embodiments of the present invention may allow the insulating layer to be formed of a SiBN layer, a SiBCN layer, a SiCN layer, and/or a BCN layer having a lower dielectric constant than the silicon nitride layer, so that the parasitic capacitance can be reduced to improve the propagation delay characteristics.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor memory device, comprising:
   forming an inter-layer dielectric on a semiconductor substrate;
   forming a bit line pattern on the inter-layer dielectric, wherein the bit line pattern comprises a sequentially stacked bit line conductive layer pattern and a bit line capping layer pattern; and
   forming a bit line spacer on sidewalls of the bit line pattern, wherein the bit line capping layer pattern and the bit line spacer are SiBCN.

2. The method according to claim 1, wherein forming the bit line capping layer pattern and the bit line spacer is performed by an atomic layer deposition (ALD) method.

3. The method according to claim 1, further comprising:
   forming a gate pattern within the inter-layer dielectric, wherein the gate pattern comprises a sequentially stacked gate conductive layer pattern and a gate capping layer pattern; and
   forming a gate spacer covering sidewalls of the gate pattern,
   wherein the gate capping layer pattern and/or the gate spacer comprises a SiBCN layer, a SiCN layer, and/or a BCN layer.

4. The method according to claim 1, further comprising:
   forming a contact hole within the interlayer dielectric;
   forming a contact spacer on a sidewall of the contact hole; and
   forming a first conductive pattern within the contact hole, wherein the sidewalls of the first conductive pattern are surrounded by the contact spacer,
   wherein the inter-layer dielectric comprises lower and upper inter-layer dielectric portions, wherein the first conductive pattern is formed to penetrate the upper inter-layer dielectric portion, and wherein the contact spacer comprises a nitride layer comprising carbon.

5. The method according to claim 1, wherein the bit line spacer does not include oxygen.

6. The method according to claim 1, wherein the bit line capping layer pattern does not include oxygen.

7. The method according to claim 2, wherein the ALD process is performed under a pressure of 0.1 torr to 3 torr and at a substrate temperature of 400° C. to 800° C.

8. The method according to claim 4, wherein the nitride layer comprises a SiBCN layer, a SiCN layer, and/or a BCN layer.

9. The method according to claim 4, further comprising:
   forming a second conductive pattern penetrating the inter-layer dielectric; and
   forming a storage node on the inter-layer dielectric wherein the storage node is electrically connected to the second conductive pattern.

10. The method according to claim 8, wherein forming the contact spacer is performed by an atomic layer deposition (ALD) method.

* * * * *